(12) United States Patent
Li

(10) Patent No.: US 12,040,837 B2
(45) Date of Patent: Jul. 16, 2024

(54) LASER EMITTING SYSTEM

(71) Applicant: CHENGDU SUPERXON COMMUNICATION TECHNOLOGY CO., LTD., Sichuan (CN)

(72) Inventor: Haiyuan Li, Sichuan (CN)

(73) Assignee: CHENGDU SUPERXON COMMUNICATION TECHNOLOGY CO., LTD., Sichuan (CN)

( * ) Notice: Subject to any disclaimer, the term of this patent is extended or adjusted under 35 U.S.C. 154(b) by 656 days.

(21) Appl. No.: 17/283,371

(22) PCT Filed: Oct. 25, 2019

(86) PCT No.: PCT/CN2019/113417
§ 371 (c)(1),
(2) Date: Apr. 7, 2021

(87) PCT Pub. No.: WO2020/083391
PCT Pub. Date: Apr. 30, 2020

(65) Prior Publication Data
US 2021/0384982 A1 Dec. 9, 2021

(30) Foreign Application Priority Data
Oct. 26, 2018 (CN) .......................... 201811259597.6

(51) Int. Cl.
*H04B 10/50* (2013.01)
*H01S 5/06* (2006.01)

(52) U.S. Cl.
CPC ..... *H04B 10/50595* (2013.01); *H01S 5/0601* (2013.01)

(58) Field of Classification Search
CPC .............. H01S 5/0601; H04B 10/5051; H04B 10/50595
See application file for complete search history.

(56) References Cited

U.S. PATENT DOCUMENTS

| 5,444,728 A * | 8/1995 | Thompson .............. H01S 5/042 372/38.07 |
| 5,481,559 A * | 1/1996 | Kawamura ........... H01S 5/3213 372/50.1 |

(Continued)

FOREIGN PATENT DOCUMENTS

| CN | 104242050 A | 12/2014 |
| CN | 106209255 A | 12/2016 |

(Continued)

OTHER PUBLICATIONS

International Search Report, Application No. PCT/CN2019/113417, Mailed Jan. 16, 2020, 2 pages.

(Continued)

*Primary Examiner* — Michael Carter
(74) *Attorney, Agent, or Firm* — Ziegler IP Law Group LLC.

(57) ABSTRACT

The present disclosure relates to the technical field of optical communication, and particularly to a laser emitting system, including a burst signal controller, a transfer switch, a power supply, a laser device and a bypass circuit, the burst signal controller is connected with the transfer switch and used for sending a burst control signal to the transfer switch, and the transfer switch is used for connecting the power supply to the laser device or the bypass circuit according to the burst control signal. The establishment time of an optical signal of a laser device can be shortened by using the laser emitting system of the present disclosure.

12 Claims, 5 Drawing Sheets

(56) References Cited

U.S. PATENT DOCUMENTS

| | | | | |
|---|---|---|---|---|
| 6,061,372 A | * | 5/2000 | Plummer | H01S 5/042 372/38.04 |
| 2005/0018726 A1 | * | 1/2005 | Dinger | H01S 5/40 372/36 |
| 2005/0271099 A1 | * | 12/2005 | Miremadi | H01S 5/06832 372/38.02 |
| 2016/0119061 A1 | | 4/2016 | Jiang et al. | |

FOREIGN PATENT DOCUMENTS

| | | | |
|---|---|---|---|
| CN | 107888294 A | 4/2018 | |
| CN | 108604933 A | 9/2018 | |
| CN | 109361468 A | 2/2019 | |
| JP | 2012044087 A | 3/2012 | |

OTHER PUBLICATIONS

The State Intellectual Property Office of People's Republic of China, First Office Action, Application No. 201811259597.6, Mailed Jan. 7, 2021, 6 pages.

Patent Cooperation Treaty, Written Opinion of the International Searching Authority, Application No. PCT/CN2019/113417, Mailed Jan. 16, 2020, 6 pages.

First Search of Priority Document, Application No. 2018112595976, 1 page.

* cited by examiner

LASER EMITTING SYSTEM

CROSS-REFERENCE TO RELATED APPLICATIONS

The present disclosure claims the priority of the Chinese patent application No. 201811259597.6, filed with the Chinese Patent Office on Oct. 26, 2018 and entitled "Laser Emitting System", the contents of which is incorporated herein by reference in their entirety.

TECHNICAL FIELD

The present disclosure relates to the technical field of optical communication, and particularly to a laser emitting system.

BACKGROUND ART

With a rapidly increasing demand for information transmission bandwidth, in order to be able to meet the demand for larger capacity, TWDM-PON (Time and Wavelength Division Multiplexed Passive Optical Network) and NGPON2 (Next Generation Passive Optical Network stage 2) are proposed. Each optical line terminal in the PON system is connected with a plurality of ONUs (Optical Network Unit).

As a light source device, a laser device is an essential constitution part of an ONU. In order to suppress performance degradation due to the noise generated in the laser device, it is generally known to add a bypass capacitor in the path through which the current or voltage flows. In addition, the laser device itself may also have stray capacitances. Due to the presence of these capacitances, the establishment time of an optical signal is too long to meet the requirement, as shown in FIG. 1.

Therefore, there is a need for a method that can shorten the establishment time of an optical signal.

SUMMARY

In order to solve the above-described technical problem, the technical solution provided by the present disclosure includes a laser emitting system, comprising a burst signal controller, a transfer switch, a power supply, a laser device and a bypass circuit, wherein the burst signal controller is connected with the transfer switch and configured to send a burst control signal to the transfer switch, and the transfer switch is configured to connect the power supply to the laser device or to the bypass circuit according to the burst control signal.

Optionally, the burst control signal is a pulsed electrical signal, wherein the pulsed electrical signal comprises a high-level signal and a low-level signal.

Optionally, the laser device is an EML laser device.

Optionally, the laser device is a DFB laser device.

Optionally, the system comprises an EML driver, and the power supply is a bias current output from the EML driver.

Optionally, the power supply comprises a voltage source and a first PMOS (P-channel Metal Oxide Semiconductor) transistor having a source connected with the voltage source, a gate connected with a control voltage for gate potential, and a drain connected with the transfer switch.

Optionally, the bypass circuit only comprises a resistor having one end connected with the transfer switch and the other end grounded.

Optionally, the bypass circuit comprises a resistor and a capacitor, wherein one end of the resistor is connected with the transfer switch, and after the resistor is connected in parallel with the capacitor, the other end of the resistor is grounded.

Optionally, the bypass circuit comprises an NPN triode and a resistor, wherein a collector of the NPN triode is connected with the transfer switch, an emitter of the NPN triode is grounded, and a base of the NPN triode is connected with a control voltage for base potential via the resistor.

Optionally, the control voltage for base potential is from a DAC.

Optionally, the bypass circuit comprises an NMOS (N-channel metal oxide semiconductor) transistor having a source connected with the transfer switch, a drain grounded, and a gate connected with a control voltage for gate potential.

Optionally, the control voltage for gate potential is from a DAC.

Optionally, the transfer switch comprises a second PMOS transistor, a third PMOS transistor and an inverter, wherein a gate of the second PMOS transistor is connected with the burst signal controller via the inverter, a drain of the second PMOS transistor is connected with the power supply, an source of the second PMOS transistor is connected with the bypass circuit, a gate of the third PMOS transistor is connected with the burst signal controller, a drain of the third PMOS transistor is connected with the power supply, and an source of the third PMOS transistor is connected with the laser device.

Optionally, the transfer switch is a single-pole double-throw transfer switch having an input end connected with the power supply, a first immovable end connected with the bypass circuit, and a second immovable end connected with the laser device.

DETAILED DESCRIPTION OF EMBODIMENTS

The technical solutions in the embodiments of the present disclosure will be clearly and completely described below with reference to the drawings of the embodiments of the present disclosure. Apparently, the embodiments described are only some of the embodiments of the present disclosure, rather than all of the embodiments of the present disclosure. All the other embodiments that are obtained by a person skilled in the art on the basis of the embodiments of the present disclosure without inventive effort shall be covered by the protection scope of the present disclosure.

The terms "first", "second", "third", "fourth", etc., if present, in the description and claims of the present disclosure and in the above-described drawings are used to distinguish between similar objects, rather than necessarily describe a particular order or sequence. It should be understood that the data so used may be interchanged as appropriate, so that the embodiments described herein can be implemented in an order other than what is illustrated or described herein. In addition, the terms "include" and "comprise" as well as any variations thereof are intended to encompass non-exclusive inclusion, for example, processes, methods, systems, products or devices comprising a series of steps or units are not necessarily limited to the steps or units clearly listed, but may include other steps or units that are not clearly listed or inherent to these processes, methods, products or devices.

Figure 1:
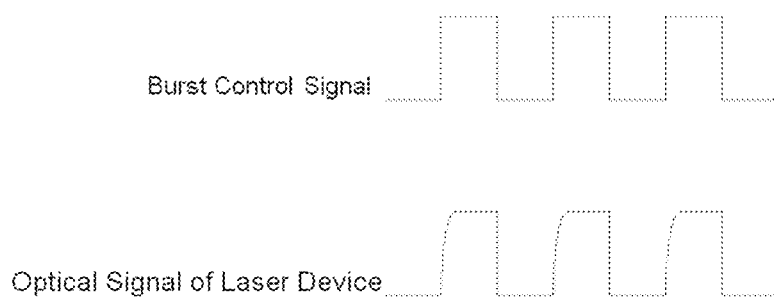
FIG. 1 is a schematic diagram of the establishment time of an optical signal of a laser device in the prior art.
Figure 2:
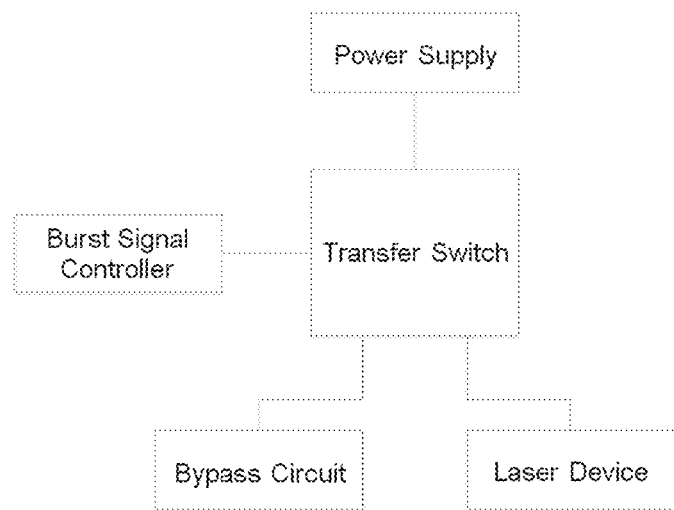
FIG. 2 is a structural schematic diagram of one embodiment of the present disclosure.
Figure 3:
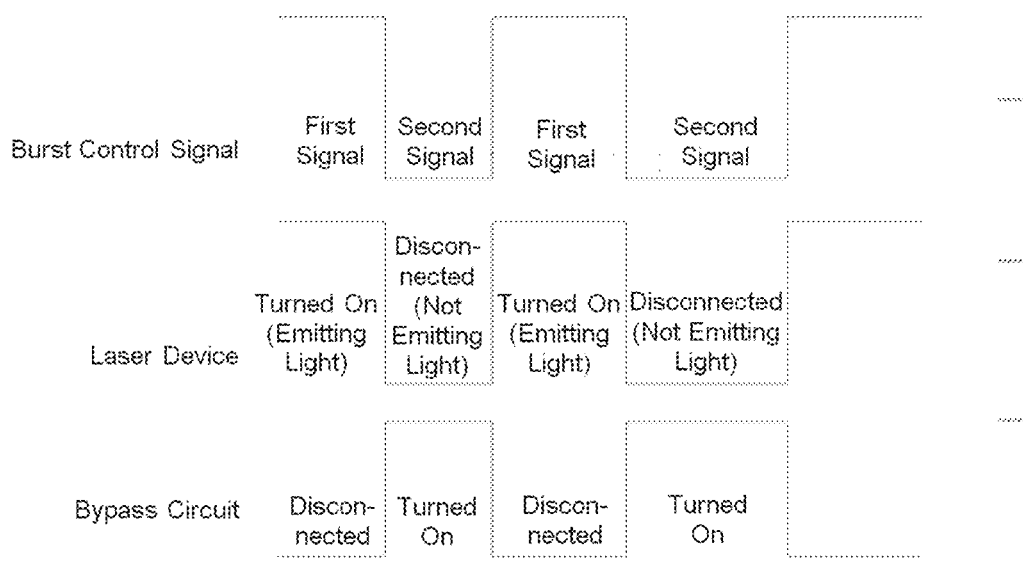
FIG. 3 is a schematic diagram showing a transfer switch turning on a laser device or a bypass circuit according to a burst control signal in one embodiment of the present disclosure.

Referring to FIG. 2, the present disclosure provides a laser emitting system, comprising a burst signal controller, a transfer switch, a power supply, a laser device and a bypass circuit. The burst signal controller is connected with the transfer switch and configured to send a burst control signal to the transfer switch, and the transfer switch is configured to connect the power supply with the laser device or with the bypass circuit according to the burst control signal. In one embodiment, the burst control signal is a pulsed electrical signal, wherein the pulsed electrical signal comprises a first signal and a second signal. In one example, the first signal is a high-level signal, and the second signal is a low-level signal. Referring to FIG. 3, the transfer switch connects the power supply to the laser device when a received burst control signal is the first signal to cause the laser device to emit light, and connects the power supply to the bypass circuit when the received burst control signal is the second signal to turn on the bypass circuit. This embodiment provides a specific implementation method, but it should be noted that the burst control signal is not limited to a pulsed electrical signal, and the first signal and the second signal are not limited to being a high-level signal and a low-level signal.

In this embodiment, the transfer switch connects the power supply to the bypass circuit or the laser device under the control of the burst control signal, so that when the laser device is required to emit light, the power supply is connected with the laser device, and when the laser device is not required to emit light, the power supply is disconnected from the laser device, thereby achieving burst driving of the laser device to meet the requirements of the time division multiplexing network for ONUs.

In this embodiment, when the laser device does not emit light, the current from the power supply does not completely stop flowing, but remains flowing in the bypass circuit, thereby maintaining continuity of the current, so that when the power supply is switched back to be connected with the laser device, a current path can be established quickly and the establishment time can be shortened.

In addition, in this embodiment, the transfer switch is switched between the laser device and the bypass circuit under the control of the burst control signal, and when the burst control signal is changed, the transfer switch is transfer switched quickly, and the operation state of the laser device can be changed immediately. Thus, the laser device of the present disclosure can realize fast response to the burst control signal.

In addition, in this embodiment, the laser device is disconnected from the power supply when it is not required to emit light, and the laser device does not emit light at all, and therefore no interfering optical signals will be generated.

In addition, the structure of this embodiment is simple and easily to realizable.

In an optional embodiment, the laser device is an EML (Electro Absorption Modulator) laser device. It should be noted, however, that although the laser device may optionally be an EML laser device in this embodiment, it is not limited to an EML laser device in the present disclosure, but may also be a DFB (Distributed Feedback Laser) laser device, etc.

A driver for driving the EML laser device to operate in a continuous mode is referred to as a continuous driver for EML laser device. A driver for driving the EML laser device to operate in a burst mode is referred to as a Burst driver for EML laser device. At present, technologies relevant to the operation of the EML laser device in a continuous mode is relatively mature. A large number of continuous drivers for EML laser device have been launched. However, the burst drivers for EML laser device are rarely heard of. With the laser emitting system provided in the embodiments of the present disclosure, on the one hand, burst operation of the EML laser device can be realized; and on the other hand, the embodiments of the present disclosure can realize a support for the EML laser device burst mode only by making a slight change on the basis of the mature continuous driver for EML laser device, which is easily to realizable.

Figure 4:
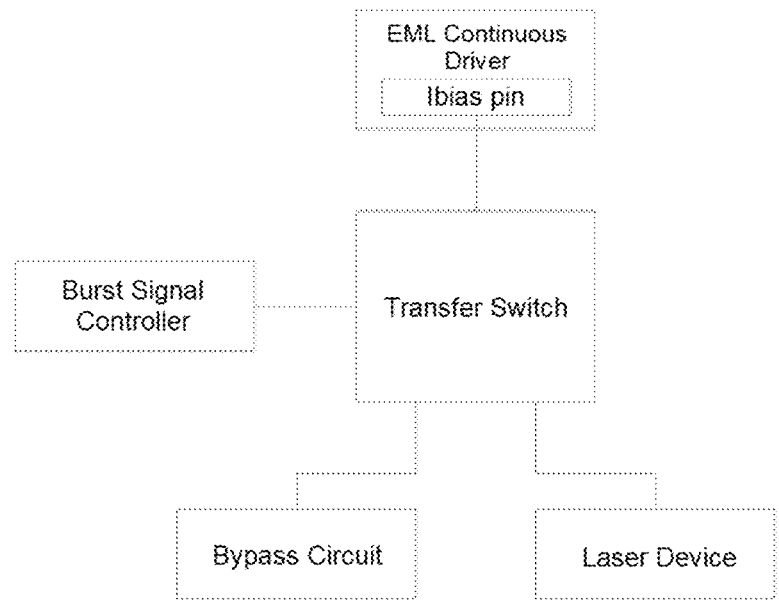
FIG. 4 is a structural schematic diagram of one embodiment of the present disclosure.

For example, in one embodiment, as shown in FIG. 4, the laser device is an EML laser device, and an $I_{bias}$ (bias current) pin of the continuous driver for EML laser device in a source mode is directly used as the power supply. Since there already exist continuous driver fors EML laser device in the prior art, this embodiment can be realized just by using the $I_{bias}$ of the EML driver directly as the power supply, without any need to provide an additional power supply, which is easy to realize.

Figure 5:
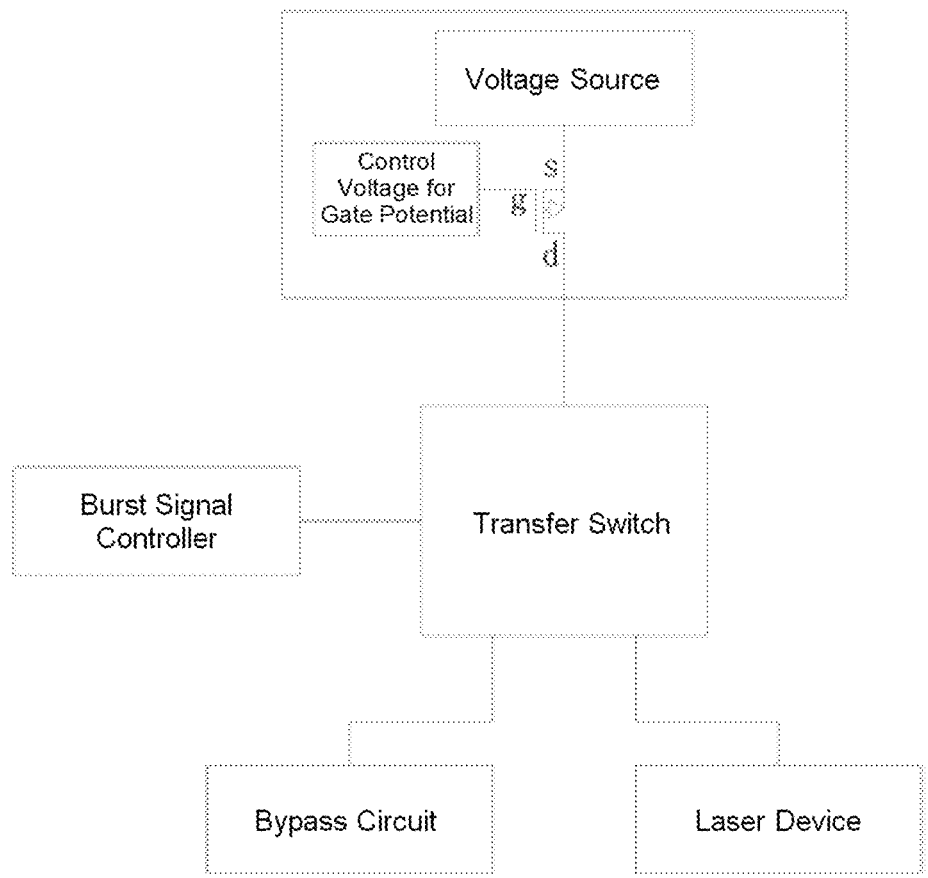
FIG. 5 is a structural schematic diagram of one embodiment of the present disclosure.

In another embodiment, as shown in FIG. 5, the power supply includes a voltage source and a first PMOS transistor. A source of the first PMOS transistor is connected with the voltage source, a gate of the first PMOS transistor is connected with a control voltage for gate potential, and a drain of the first PMOS transistor is connected with the transfer switch. In one embodiment, the voltage source comprises a DCDC converter, with the output voltage being 1.8 V, the voltage taken up by the laser device during operation is 1.5 V, the remaining voltage of 0.3 V is applied to the resistor $R_{ds}$ of the PMOS transistor, and by controlling the gate of the PMOS transistor, it is possible to control the magnitude of the $R_{ds}$, and thereby control the magnitude of the current supplied to the laser device.

Figure 6:
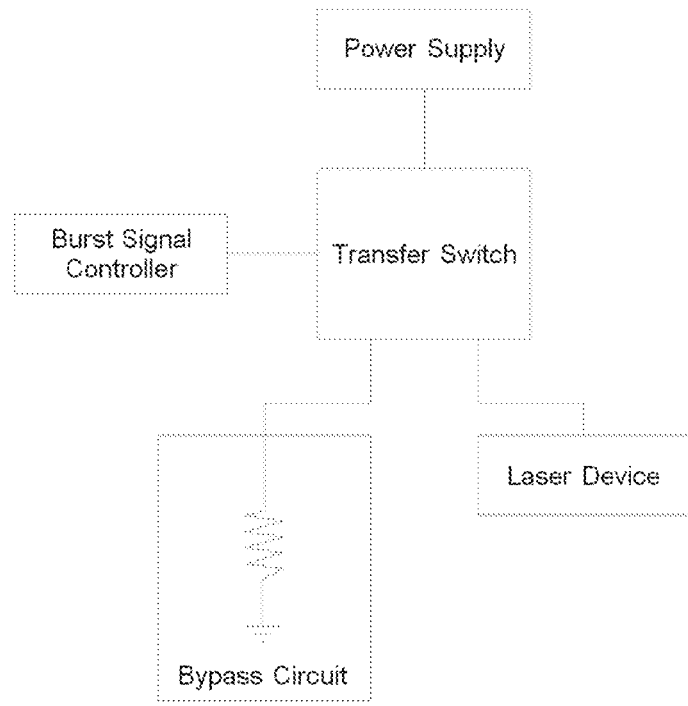
FIG. 6 is a structural schematic diagram of one embodiment of the present disclosure.
Figure 7:
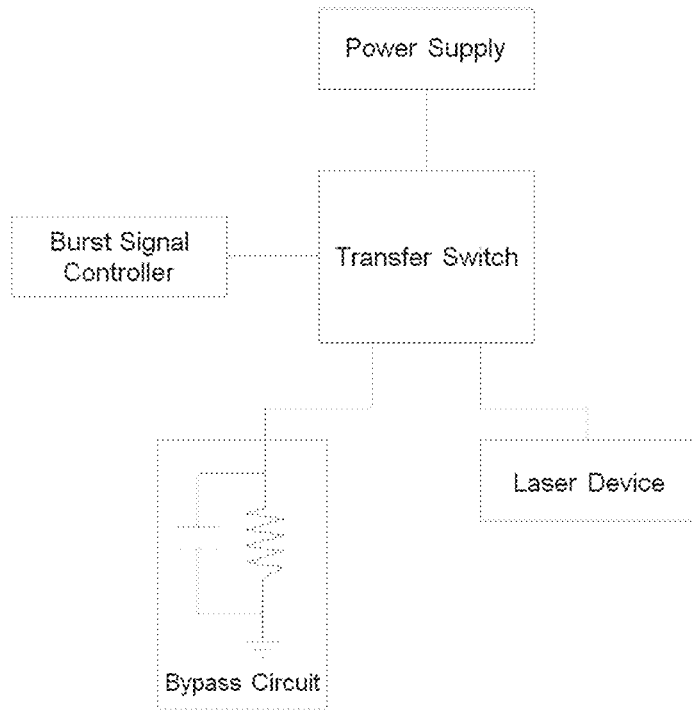
FIG. 7 is a structural schematic diagram of one embodiment of the present disclosure.
Figure 8:
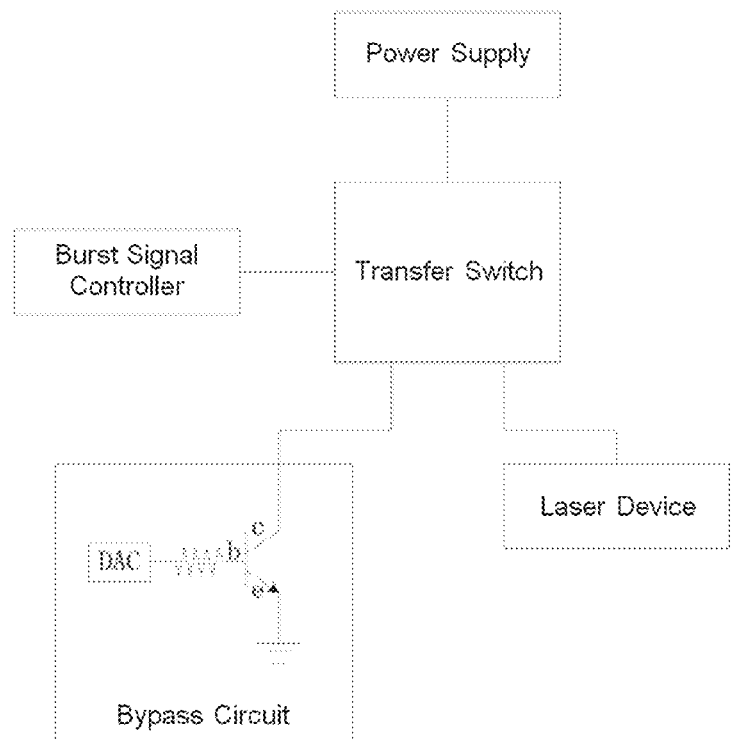
FIG. 8 is a structural schematic diagram of one embodiment of the present disclosure.
Figure 9:
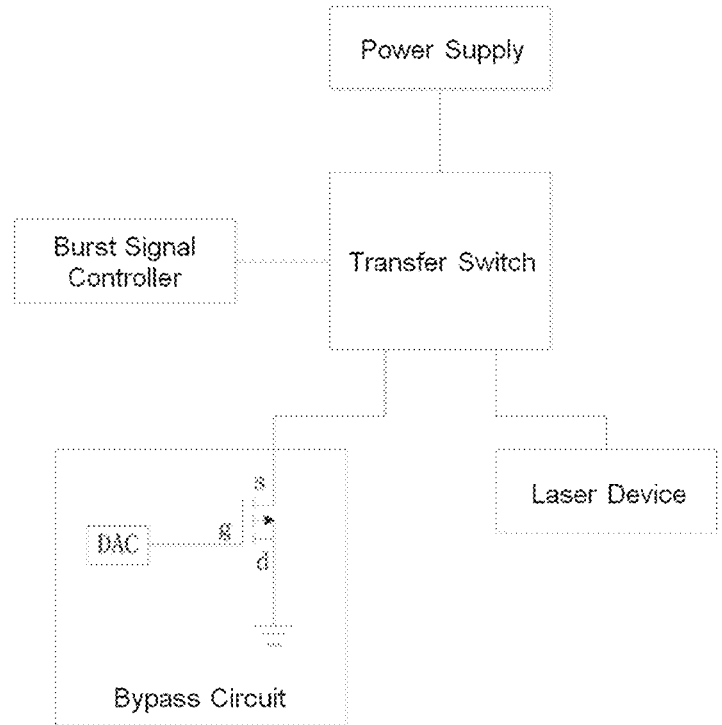
FIG. 9 is a structural schematic diagram of one embodiment of the present disclosure.

In one embodiment, as shown in FIG. 6, the bypass circuit comprises only a resistor having one end connected with the transfer switch and the other end grounded. In one embodiment, as shown in FIG. 7, the bypass circuit comprises a resistor and a capacitor, one end of the resistor is connected with the transfer switch, and after the resistor is connected in parallel with the capacitor, the other end of the resistor is grounded. In one embodiment, as shown in FIG. 8, the bypass circuit comprises an NPN triode and a resistor, wherein a collector of the NPN triode is connected with the transfer switch, an emitter of the NPN triode is grounded, and a base of the NPN triode is connected with a control voltage for base potential via the resistor, and the control voltage for base potential can be from a DAC (Digital to analog converter). In one embodiment, as shown in FIG. 9, the bypass circuit comprises an NMOS transistor having a source connected with the transfer switch, a drain grounded, and a gate connected with a control voltage for gate potential, and the control voltage for gate potential can be from a DAC. It should be noted that the bypass circuit of the present disclosure is not limited to the above-described implementation modes, and any bypass circuit is feasible as long as it can maintain the continuity of the current.

Figure 10:
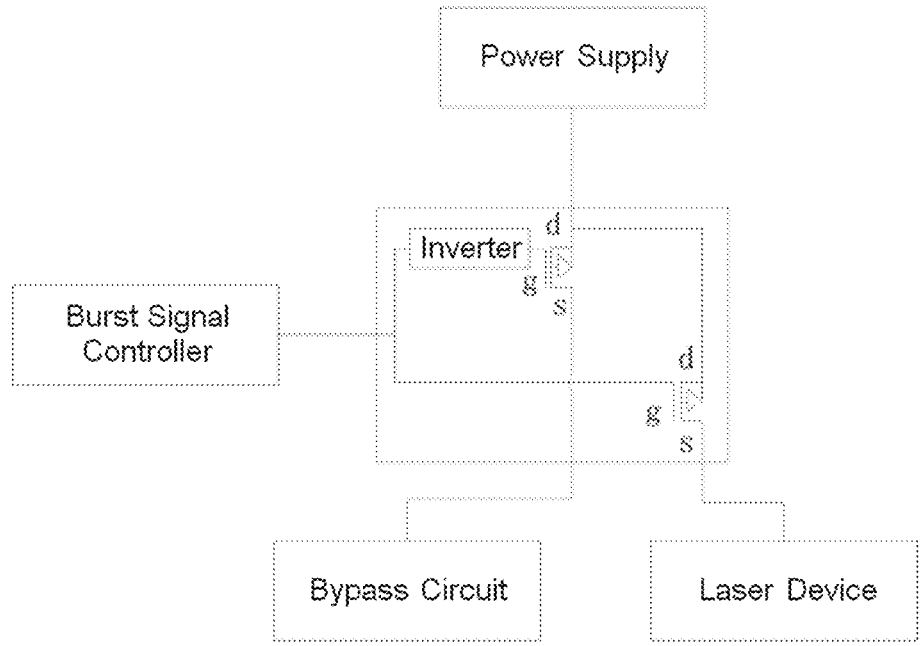
FIG. 10 is a structural schematic diagram of one embodiment of the present disclosure.
Figure 11:
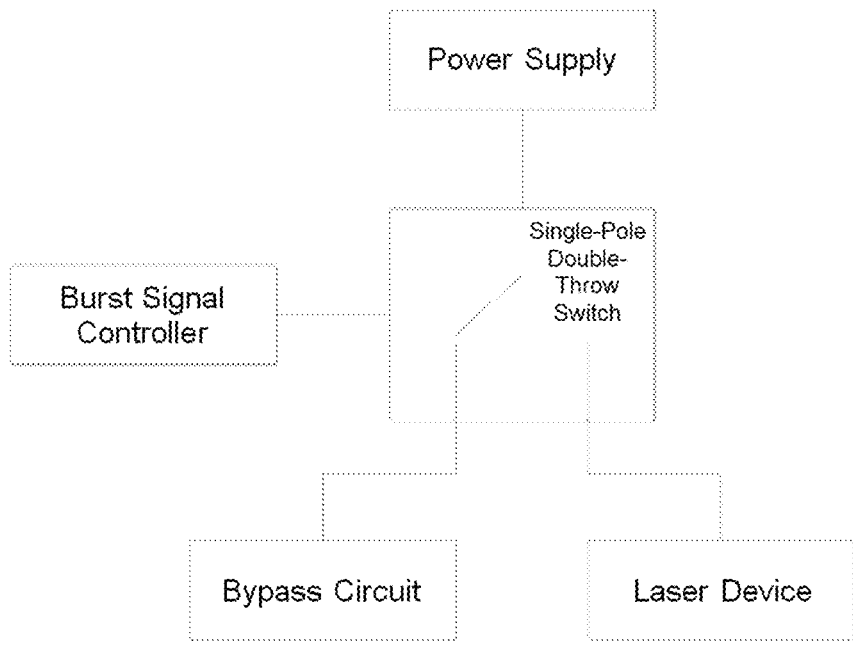
FIG. 11 is a structural schematic diagram of one embodiment of the present disclosure.

In one embodiment, as shown in FIG. 10, the transfer switch comprises a second PMOS transistor, a third PMOS transistor and an inverter, wherein a gate of the second PMOS transistor is connected with the burst signal controller via the inverter, a drain of the second PMOS transistor is connected with the power supply, a source of the second PMOS transistor is connected with the bypass circuit, a gate of the third PMOS transistor is connected with the burst signal controller, a drain of the third PMOS transistor is connected with the power supply, and an source of the third PMOS transistor is connected with the laser device. In one embodiment, as shown in FIG. 11, the transfer switch is a single-pole double-throw switch having an input end connected with the power supply, a first immovable end connected with the bypass circuit, and a second immovable end connected with the laser device. In the embodiment of the single-pole double-throw transfer switch, compared with the aforementioned embodiment in which the transfer switch is realized by using the PMOS transistor, the single-pole double-throw transfer switch has the advantageous effects of saving the area of the circuit board and reducing the cost, and can also avoid EMI (Electro Magnetic Interference) generated by high-speed continuous switching in the case of the PMOS transistor transfer switch, and therefore can avoid interfering with other devices. It should be noted that the transfer switch of the present disclosure is not limited to the above-described implementation modes, and any transfer switch is feasible as long as it can connect the power supply to the laser device or to the bypass circuit according to the burst control signal.

The laser emitting system provided by the present disclosure can shorten the establishment time of the optical signal of the laser device as compared with the prior art.

It should be noted that the various embodiments in the present description are all described in a progressive manner, and each embodiment focuses on the aspects by which it differs from other embodiments, and as to the same or similar aspects among the embodiments, mutual reference can be made.

The above-described are merely preferred embodiments of the present disclosure. It should be noted that the preferred embodiments should not be considered as limiting the present disclosure. The scope of protection of the present disclosure shall be determined by the scope defined by the claims. For those of ordinary skills in the art, some improvements and modifications may be made without departing from the spirit and scope of the present disclosure, and all the improvements and modifications shall be considered to be within the scope of protection of the present disclosure.

INDUSTRIAL APPLICABILITY

The present disclosure discloses a laser emitting system, which can shorten the establishment time of an optical signal, effectively alleviating the problem in the prior art that the establishment time of an optical signal is too long due to the addition of a bypass capacitor and the presence of the stray capacitances of the laser device itself.

What is claimed is:

1. A laser emitting system, comprising a burst signal controller, a transfer switch, a power supply, a laser device and a bypass circuit, wherein the burst signal controller is connected with the transfer switch and configured to send a burst control signal to the transfer switch, and the transfer switch is configured to connect the power supply to the laser device or to the bypass circuit according to the burst control signal, wherein the bypass circuit comprises only a resistor having one end connected with the transfer switch and the other end grounded.

2. The system according to claim 1, wherein the burst control signal is a pulsed electrical signal, and the pulsed electrical signal comprises a high-level signal and a low-level signal.

3. The system according to claim 2, wherein the laser device is an Electro Absorption Modulator (EML) laser device.

4. The system according to claim 2, wherein the laser device is a Distributed Feedback Laser (DFB) laser device.

5. The system according to claim 2, wherein the system comprises an EML driver, and the power supply is a bias current output from the EML driver.

6. The system according to claim 2, wherein the power supply comprises a voltage source and a first PMOS transistor, wherein the first PMOS transistor has a source connected with the voltage source, a gate connected with a control voltage for gate potential, and a drain connected with the transfer switch.

7. The system according to claim 1, wherein the laser device is an Electro Absorption Modulator (EML) laser device.

8. The system according to claim 1, wherein the laser device is a Distributed Feedback Laser (DFB) laser device.

9. The system according to claim 1, wherein the system comprises an EML driver, and the power supply is a bias current output from the EML driver.

10. The system according to claim 1, wherein the power supply comprises a voltage source and a first PMOS transistor, wherein the first PMOS transistor has a source connected with the voltage source, a gate connected with a control voltage for gate potential, and a drain connected with the transfer switch.

11. The system according to claim 1, wherein the transfer switch comprises a second PMOS transistor, a third PMOS transistor and an inverter, wherein a gate of the second PMOS transistor is connected with the burst signal controller via the inverter, a drain of the second PMOS transistor is connected with the power supply, an source of the second PMOS transistor is connected with the bypass circuit, a gate of the third PMOS transistor is connected with the burst signal controller, a drain of the third PMOS transistor is connected with the power supply, and a source of the third PMOS transistor is connected with the laser device.

12. The system according to claim 1, wherein the transfer switch is a single-pole double-throw transfer switch, wherein the single-pole double-throw transfer switch has an input end connected with the power supply, a first immovable end connected with the bypass circuit, and a second immovable end connected with the laser device.

* * * * *